United States Patent
Bauer et al.

(10) Patent No.: US 7,619,304 B2
(45) Date of Patent: Nov. 17, 2009

(54) PANEL AND SEMICONDUCTOR COMPONENT HAVING A COMPOSITE BOARD WITH SEMICONDUCTOR CHIPS AND PLASTIC PACKAGE MOLDING COMPOUND AND METHOD FOR THE PRODUCTION THEREOF

(75) Inventors: Michael Bauer, Nittendorf (DE); Kai Chong Chan, Singapore (SG)

(73) Assignee: Infineon Technologies AG, Munich (DE)

( * ) Notice: Subject to any disclaimer, the term of this patent is extended or adjusted under 35 U.S.C. 154(b) by 273 days.

(21) Appl. No.: 11/445,358

(22) Filed: Jun. 1, 2006

(65) Prior Publication Data

US 2006/0278972 A1 Dec. 14, 2006

(30) Foreign Application Priority Data

Jun. 1, 2005 (DE) ................ 10 2005 026 098

(51) Int. Cl.
*H01L 23/53* (2006.01)
(52) U.S. Cl. ............... 257/678; 257/677; 257/680; 257/688; 257/733; 257/787; 257/780; 257/796; 257/E23.001; 257/E23.194
(58) Field of Classification Search ......... 257/678–733, 257/787–796, E23.001, E23.194
See application file for complete search history.

(56) References Cited

U.S. PATENT DOCUMENTS 5,989,982 A 11/1999 Yashikazu
6,031,284 A * 2/2000 Song ............... 257/701
6,723,584 B2 * 4/2004 Kovac et al. ......... 438/118
2003/0094695 A1 5/2003 Hedler et al.
2003/0218263 A1 11/2003 Blaszczak et al.
2004/0232543 A1 * 11/2004 Goller et al. ......... 257/700
2005/0064628 A1 * 3/2005 Doescher ............. 438/110

FOREIGN PATENT DOCUMENTS

DE 102 13 296 10/2003
EP 1 067 601 1/2001

* cited by examiner

*Primary Examiner*—Wael Fahmy
*Assistant Examiner*—Marc Armand
(74) *Attorney, Agent, or Firm*—Dicke, Billig, Czaja PLLC

(57) ABSTRACT

A panel and a semiconductor component including a composite board with semiconductor chips and plastic package molding compound and a method for the production thereof is disclosed. In one embodiment, the panel includes a composite board with semiconductor chips arranged in rows and columns in a corresponding plastic package molding compound with a plurality of semiconductor component positions. The thickness of the plastic package molding compound corresponds to the thickness of the semiconductor chips so that a coplanar upper side and a coplanar rear side are formed on the composite board. Located on the coplanar rear side of the composite board is a plastic layer whose coefficient of thermal expansion corresponds to the coefficient of thermal expansion of the composite board. Located on the coplanar upper side of the composite board is a wiring structure which has corresponding external contacts.

8 Claims, 7 Drawing Sheets

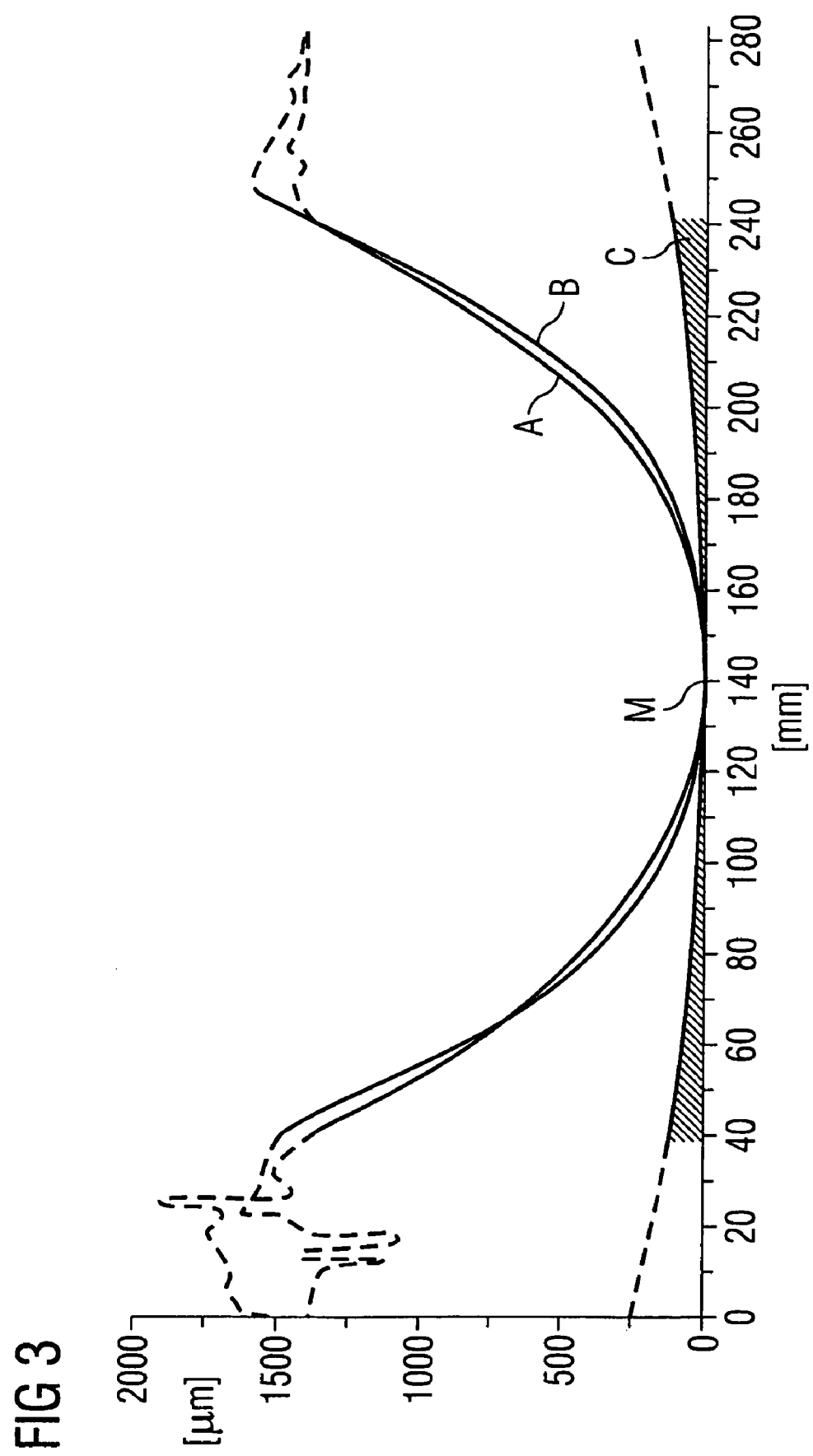

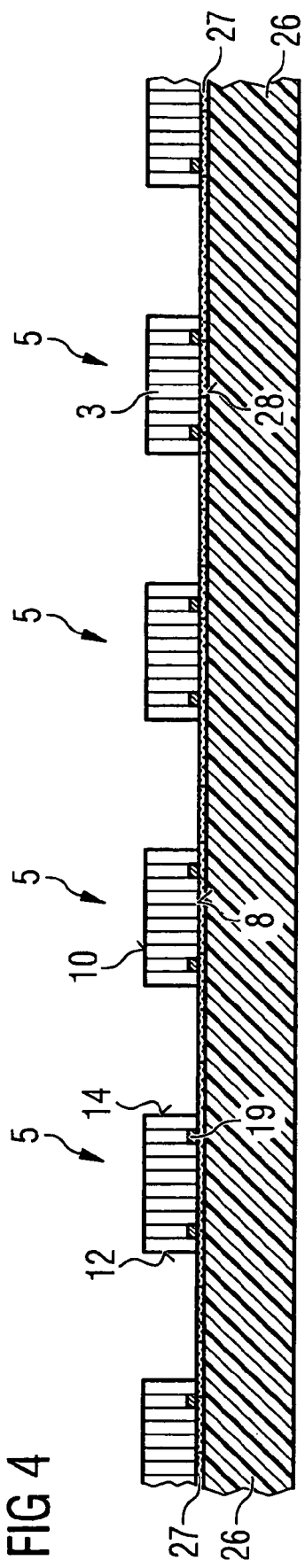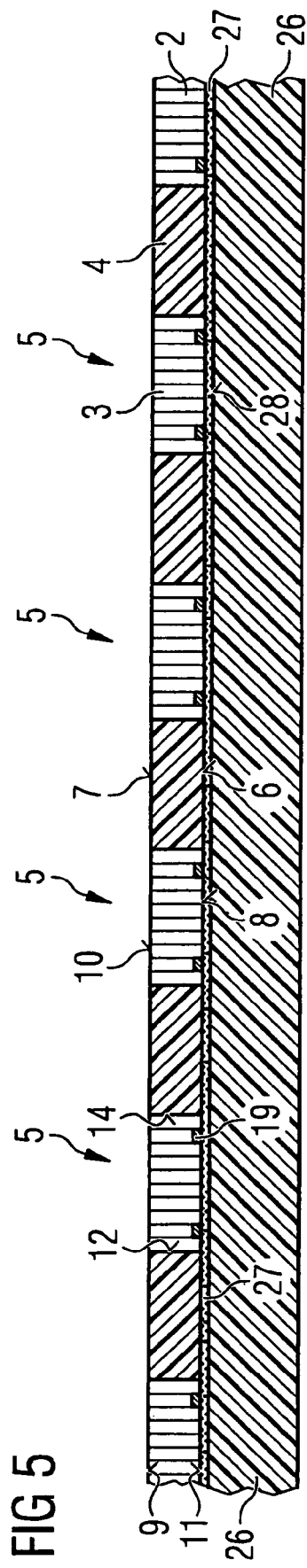

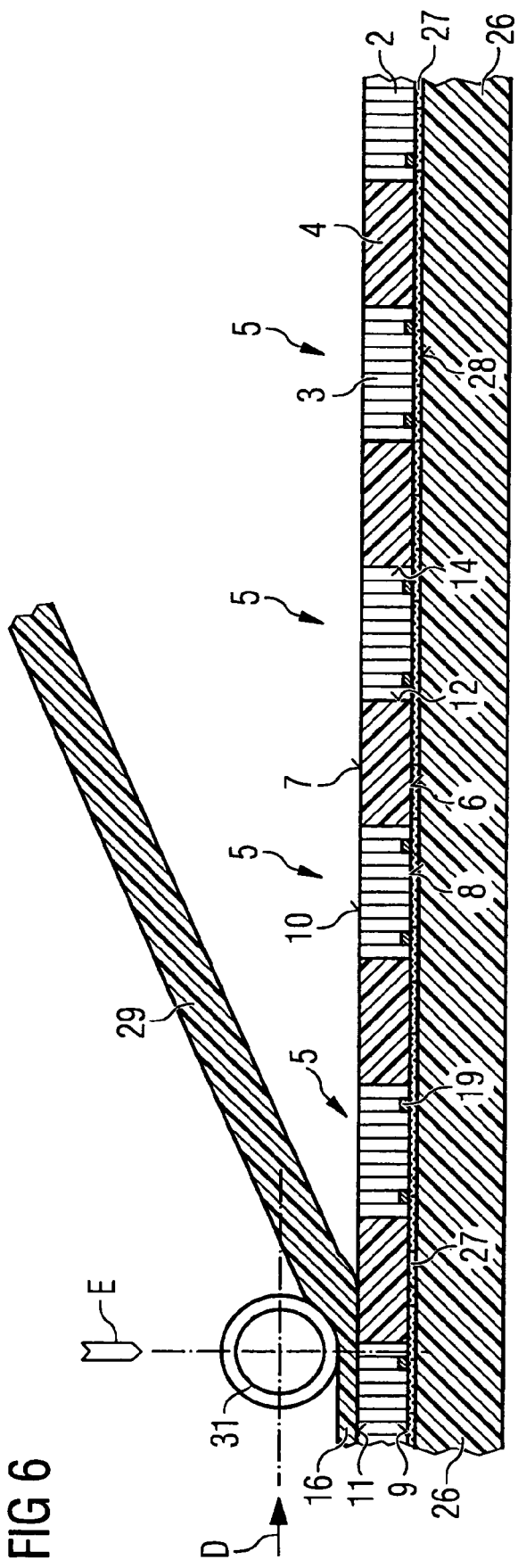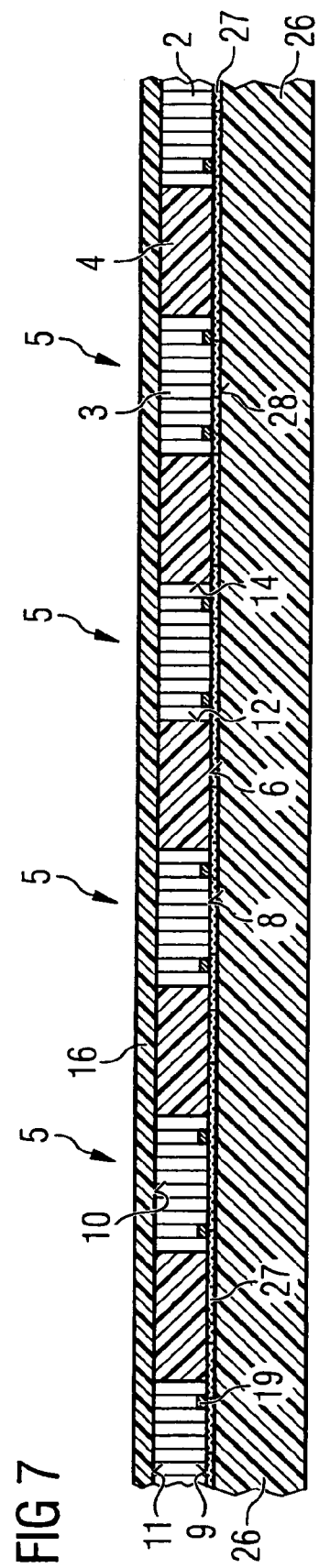

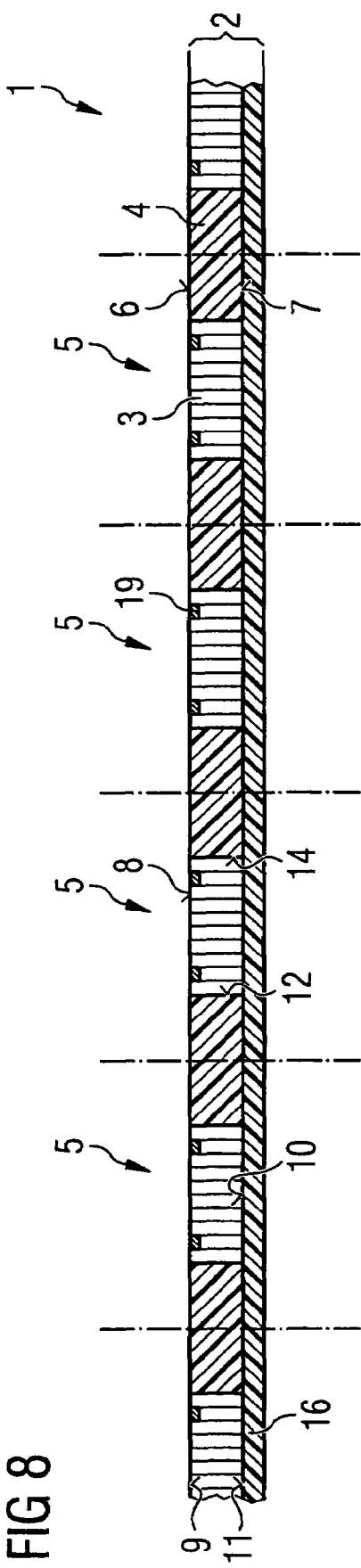
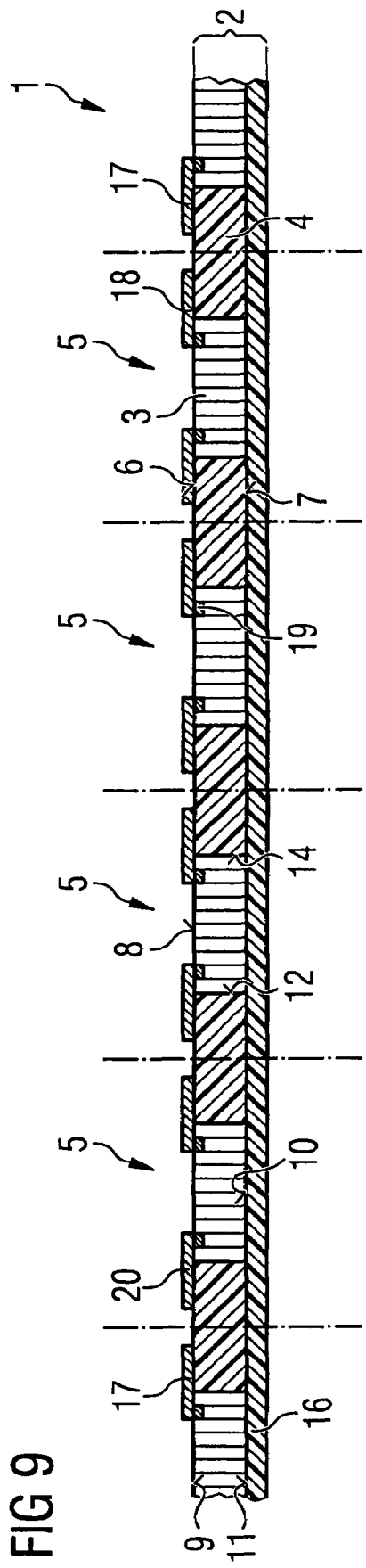

PANEL AND SEMICONDUCTOR COMPONENT HAVING A COMPOSITE BOARD WITH SEMICONDUCTOR CHIPS AND PLASTIC PACKAGE MOLDING COMPOUND AND METHOD FOR THE PRODUCTION THEREOF

CROSS-REFERENCE TO RELATED APPLICATIONS

This Utility Patent Application claims priority to German Patent Application No. DE 10 2005 026 098.5 filed on Jun. 1, 2005, which is incorporated herein by reference.

FIELD OF THE INVENTION

The invention relates to a panel and a semiconductor component having a composite board with semiconductor chips. In addition to the semiconductor chips, this composite board also includes a plastic package molding compound. The invention further relates to a method for producing a panel and a semiconductor component.

BACKGROUND

A panel for producing a plurality of semiconductor components is known from DE 102 13 296 A. A panel of this type consists of a plurality of semiconductor positions arranged in rows and columns with semiconductor chips embedded in a plastic package molding compound. It is furthermore known from DE 102 13 296 A that a problem with this type of panel is that severe bowing of the panel can occur during the manufacturing process as a result of the different coefficients of expansion between a carrier substrate and the plastic package molding compound and the semiconductor chips embedded therein. If this type of bowing is very great, in practice it is almost impossible to undertake photolithographic structuring of wiring structures, for example.

For this reason, in the known panel a wiring structure is applied to a rigid substrate before the semiconductor chips and connecting elements between substrate and semiconductor chip, and finally the plastic compound are applied to this rigid wiring substrate. The photolithographic structuring of a wiring structure is thus carried out on a completely flat surface of a substrate and not on any composite board comprising semiconductor chips and plastic package molding compound which exhibit bowing under thermal loading.

For these and other reasons there is a need for the present invention.

SUMMARY

The present invention provides a panel and a semiconductor component including a composite board with semiconductor chips and plastic package molding compound and a method for the production thereof. In one embodiment, the panel includes a composite board with semiconductor chips arranged in rows and columns in a corresponding plastic package molding compound with a plurality of semiconductor component positions. The thickness of the plastic package molding compound corresponds to the thickness of the semiconductor chips so that a coplanar upper side and a coplanar rear side are formed on the composite board. Located on the coplanar rear side of the composite board is a plastic layer whose coefficient of thermal expansion corresponds to the coefficient of thermal expansion of the composite board. Located on the coplanar upper side of the composite board is a wiring structure which has corresponding external contacts.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 3 illustrates a schematic diagram showing a comparison of the bowing of a panel with semiconductor wafer structure according to the prior art and a panel according to an embodiment of the present invention.

FIG. 4 illustrates a schematic cross section through a carrier with semiconductor chips in semiconductor component positions.

FIG. 5 illustrates a schematic cross section through the carrier according to FIG. 4 after application of a plastic package molding compound between the semiconductor chips and formation of a coplanar rear side and a coplanar upper side of a composite board.

FIG. 6 illustrates a schematic cross section through the carrier according to FIG. 5 when laminating a plastic film onto the coplanar rear side of the composite board.

FIG. 7 illustrates a schematic cross section through the carrier with composite board according to FIG. 6 after laminating the plastic film.

FIG. 8 illustrates a schematic cross section through the self-supporting composite board after removing the carrier from the upper side of the composite board.

FIG. 9 illustrates a schematic cross section through the self-supporting composite board according to FIG. 8 after applying a wiring structure to the coplanar upper side of the composite board.

DETAILED DESCRIPTION

Figure 1:
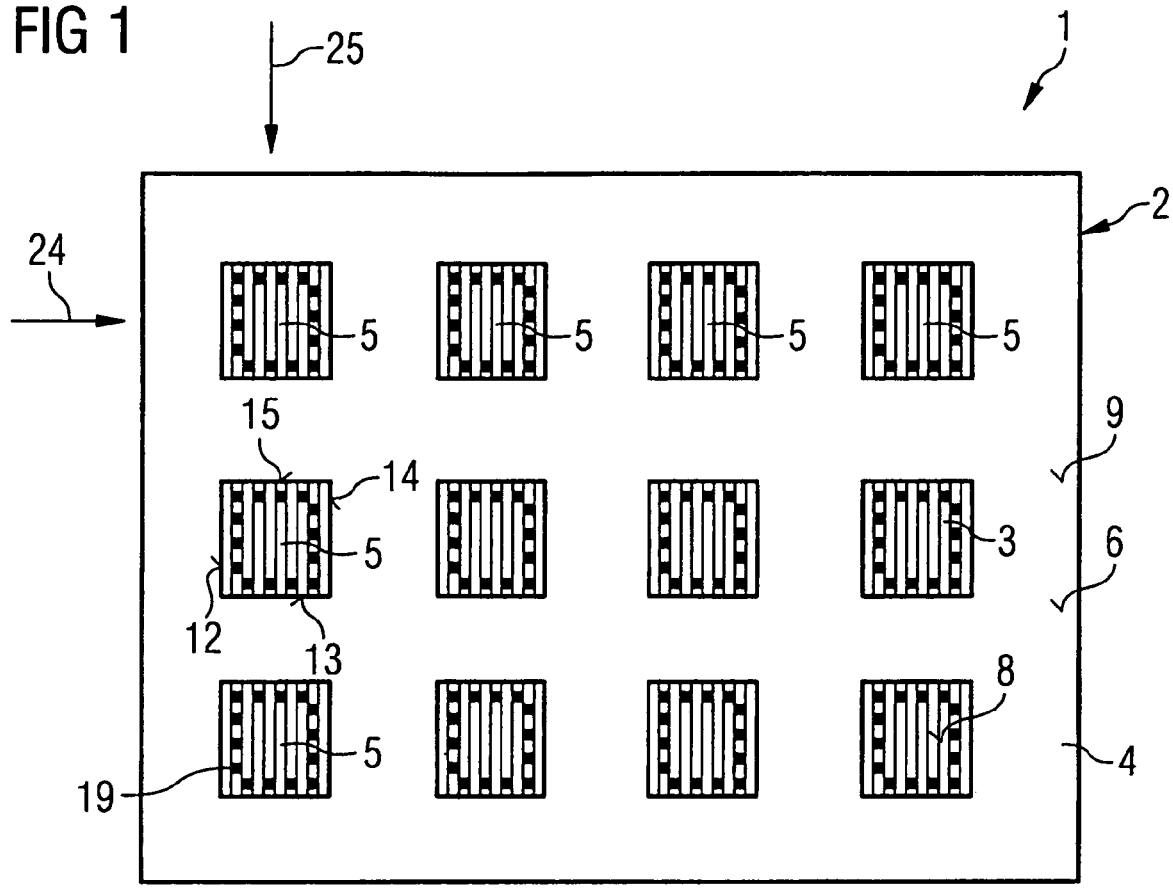
FIG. 1 illustrates a schematic plan view of a composite board of a panel according to one embodiment of the invention.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a wiring structure on a composite board having semiconductor chips and plastic package molding compound in order to reduce the overall costs of the manufacturing process for corresponding semiconductor components.

In one embodiment, the present invention provides a composite board having semiconductor chips and plastic package molding compound which provides almost completely planar upper sides and rear sides under different thermal loading so that corresponding wiring structures can be applied by means of photolithography or using printing techniques, and insulating layers can also be applied to these upper sides and/or rear sides. For this purpose the bowing of this type of composite board having semiconductor chip and plastic package molding compound should be negligibly small in order to precisely dispose a wiring structure on the upper side and/or on the rear side of the composite board.

In accordance with one embodiment of the invention, a panel having a composite board with semiconductor chips arranged in rows and columns and a plastic package molding compound with a plurality of semiconductor component positions is provided. For this purpose the composite board has an upper side and a rear side. The thickness of the plastic package molding compound of the composite board corresponds to the thickness of the semiconductor chips so that the active upper sides of the semiconductor chips form a coplanar surface with the upper side of the composite board and the rear sides of the semiconductor chips form a coplanar surface with the rear side of the composite board. For this purpose, the plastic package molding compound exclusively embeds the edge sides of the semiconductor chips completely in the plastic package molding compound. The panel furthermore has a plastic layer on the coplanar rear side of the composite board and a wiring structure on the coplanar upper side of the composite board.

With a panel of this type, any bowing during subsequent temperature processes to fabricate semiconductor components is almost eliminated since the plastic package molding compound is merely disposed on the edge sides of the semiconductor chips or encapsulates the edge sides of the semiconductor chips and the plastic package molding compound does not extend unilaterally either over the rear side and/or the upper side of the semiconductor chips as in the prior art. Consequently, a panel having the contour of a semiconductor wafer can be further processed like a semiconductor wafer to form corresponding semiconductor components using the known technologies for semiconductor wafers. As a result of the lack of plastic package molding compound extending on the upper side and/or the rear side of the semiconductor chips in conventional technologies, a completely flat composite board is obtained for all process temperatures required to produce a wiring structure or to apply an insulating coating to these coplanar surfaces.

In a one embodiment of the invention, the coefficient of thermal expansion of the plastic layer on the rear side of the composite board corresponds to the coefficient of thermal expansion of the composite board. The coefficient of thermal expansion of the plastic layer on the rear side of the composite board can be matched to the coefficient of thermal expansion of the composite board itself by filling the plastic coating on the rear side of the composite board with corresponding ceramic particles so that the otherwise high coefficient of thermal expansion known for plastics of around 18 ppm/oC can be reduced to a matched coefficient of thermal expansion for a composite board comprising semiconductor chips and plastic package molding compound.

Furthermore, the thickness of this plastic layer, which at the same time has an insulating function for the rear sides of the semiconductor chips, is so small that the action of shear forces on the coplanar surface of the composite board is negligibly small. This not only has the result that the composite board remains completely flat even after application of this plastic layer but also that, under thermal loadings, none impairs the precision of the structuring of the opposite coplanar upper side of the composite board. Consequently, a wiring structure can be applied with high precision to the upper side of the composite board using the process for semiconductor wafers conventional in semiconductor technology.

In addition, this panel has no additional wiring substrate on which a wiring structure is to be applied before embedding the semiconductor chips in a plastic package molding compound. The manufacture of this type of substrate with corresponding wiring structure involves high costs and can be completely omitted in the case of the panel according to the invention. Furthermore, cost-intensive bonding is eliminated in order to electrically connect the semiconductor chip to the substrate by means of connecting elements such as bond wires, which increases the reliability of the semiconductor component.

The wiring structure on the upper side of the composite board preferably has conductor tracks which extend from contact areas on the active upper sides of the semiconductor chips to external contact areas on the plastic package molding compound of the composite board. In this wiring structure, contact vias such as are otherwise usually used in wiring substrates can be completely dispensed with since the wiring structure can be disposed directly on the plastic package molding compound and on the active upper sides of the semiconductor chip, i.e., on the coplanar surface of the composite board. A structured masking lacquer layer can be disposed on a wiring structure of this type, leaving external contact areas exposed. These external contact areas can have surface-mountable external contacts, solder balls preferably being provided as external contacts.

In one embodiment, a semiconductor component consists of one of the semiconductor component positions of this type of panel and, in contrast to the prior art in accordance with DE 102 13 269 A, has no wiring substrate with a wiring structure with contact vias and with corresponding external contact areas on the wiring substrate. Rather, this type of semiconductor component according to the invention includes a plastic package molding compound which surrounds the edge sides of the semiconductor chip, wherein on a coplanar upper side the wiring structure is arranged in the form of conductor tracks from corresponding contact areas on the upper side of the semiconductor chip and external contact areas on the upper side of the plastic package molding compound. Since the panel can already have a masking lacquer layer, leaving external contact areas exposed, this masking lacquer layer is also disposed on the upper side of the semiconductor component, wherein the external contact areas can bear surface-mountable external contacts, preferably comprising balls.

A method for producing a panel comprising a composite board with semiconductor chips arranged in rows and columns in a plastic package molding compound with a plurality of semiconductor component positions includes the following process.

A semiconductor wafer having a plurality of semiconductor chip positions arranged in rows and columns is fabricated, the semiconductor chip positions having active upper sides and rear sides of the semiconductor chips. Then, the semiconductor wafer with the plurality of semiconductor chip positions is separated into a plurality of semiconductor chips.

A carrier, having a semiconductor wafer contour, is loaded with these semiconductor chips in corresponding semiconductor component positions, the semiconductor chips being fixed with their active upper sides on the carrier in rows and columns. A plastic package molding compound is then subsequently applied to the carrier in a manner such that merely the edge sides of the semiconductor chips are embedded in the plastic package molding compound so that a composite board with coplanar surfaces in relation to the upper sides and the rear sides of the semiconductor chip is formed.

Since the rear sides of the semiconductor chips of the coplanar upper sides of the composite board are freely accessible, whereas the active upper sides of the semiconductor chips are still fixed on the supporting plate, a plastic layer having a coefficient of thermal expansion matched to the composite board is applied to the exposed rear side of the composite board. The carrier can then be removed, thereby forming a self-supporting panel. Since the upper side of the composite board with the active upper sides of the semiconductor chips is freely accessible, a wiring structure is applied to this upper side of the composite board.

With this method, no substrate of any kind is required to form a panel. Rather, only a reusable carrier is used to produce a completely flat composite board comprising plastic package molding compound and semiconductor chips in a thickness corresponding to the thickness of the semiconductor chips. The application of an additional plastic layer to the rear side of the composite board merely serves insulating purposes and, on account of the adhesive effect of this plastic layer on the rear sides of the semiconductor chips, this plastic layer can at the same time improve the anchoring or the adhesion of the semiconductor chip in the semiconductor component positions of the panel.

Separation of the semiconductor wafer into a plurality of semiconductor chips can be effected by means of a sawing technique. On the other hand, it is also possible to separate the semiconductor wafer into semiconductor chips by means of laser ablation.

In one embodiment, the loading of a carrier with semiconductor chips in semiconductor component positions is carried out by means of automatic insertion equipment. In this case, the semiconductor chips are fixed with their active upper sides on the carrier in rows and columns preferably on a double-sided adhesive film on the upper side of the carrier. These double-sided adhesive films have the advantage that the carrier can be removed from the forming composite board comprising plastic package molding compound and semiconductor chips under just low heating.

The application of a plastic package molding compound to the carrier, thereby embedding the semiconductor chips with their edge sides in the plastic package molding compound and forming a composite board with coplanar surfaces in relation to the upper sides and the rear sides of the semiconductor chips, can preferably be effected by means of an injection molding technique and/or by means of a dispensing technique. In both cases, a composite board is formed where only the edge sides of the semiconductor chips are surrounded by a plastic package molding compound while the rear side and the active upper side of the semiconductor chips lie on coplanar surfaces which are initially still freely accessible.

The application of a plastic layer to the exposed rear side of the composite board can be carried out by laminating a plastic film having a coefficient of thermal expansion matched to the composite board. Plastic films of this type are prepared using fillers so that the coefficient of thermal expansion largely corresponds to the coefficient of expansion of the composite board having semiconductor chips and plastic package molding compound. At the same time, it is thereby prevented that extreme shear stresses, which could cause delamination of the film from the composite board, occur during further production processes or during later testing.

A semiconductor component fabricated using this type of composite board consequently has a longer lifetime and is protected from delamination compared to conventional components. Instead of laminating a plastic film as plastic layer, a plastic layer can be applied to the rear side of the composite board by spin coating and/or spraying-on a plastic compound having a coefficient of thermal expansion matched to the composite board. Spin coating and spraying-on methods of this type are known for semiconductor technology and can easily also be applied to a composite board having the contours of a semiconductor wafer.

After the carrier has been removed and a self-supporting panel or a self-supporting composite board with a rear side correspondingly insulated by a plastic layer is provided, a wiring structure can be applied to the coplanar upper side of the composite board by applying a metal coating followed by structuring by means of photolithography and etching. This structuring can be carried out with high precision especially as the composite board exhibits no perturbing bowing or the bowing is of a negligible order of magnitude.

Almost the same process as are used to produce a panel are used to produce semiconductor components and, at the end of the application of a wiring structure to the accessible upper side of the composite board, the panel can then be separated into individual semiconductor components. Prior to the separation, surface-mountable external contacts in the form of solder balls can be soldered onto the wiring structure and, in particular, onto the external contact areas formed there.

In order to prevent solder material of the solder balls also wetting the conductor tracks of the wiring structure during this soldering process, a structured masking lacquer layer is previously applied to the wiring structure, leaving the external contact areas exposed. On the other hand, if the wiring structure is appropriately prepared and a structured masking lacquer layer appropriately provided, it is also possible to apply the solder balls only when the panel has already been separated into individual semiconductor components. The advantage of separating the panel only after loading with corresponding solder balls is that all the semiconductor component positions of the panel can be loaded with corresponding solder balls using a single process step.

The present invention provides an easy-to-handle process for fabricating semiconductor components and, in addition, this process is extremely cost-effective. Furthermore, the material of the rear side coating can be matched to the special requirements of a composite board comprising plastic package molding compound with semiconductor chips embedded therein. Further, the bowing of the composite board can be kept negligibly small as a result of the structure of the composite board according to the invention. Finally, both the method and also the semiconductor component are suitable for mass production. Also, the rear sides with the correspondingly completely flat plastic layer can be precisely marked subsequently by corresponding laser removal. It is thus achieved that the panel and therefore also the semiconductor components achieve a negligible degree of bowing which reduces the risk of delamination and delivers reliable semiconductor components.

FIG. 1 illustrates a schematic plan view of a composite board 2 of a panel 1 according to one embodiment of the invention. The panel 1 illustrated here is only a section of a panel 1 with a semiconductor wafer contour. A plurality of semiconductor component positions 5 are arranged with at least respectively one semiconductor chip 3 in rows 24 and columns 25 in a plastic package molding compound 4 in a manner such that respectively the edge sides 12, 13, 14, and 15 of the semiconductor chips 3 are embedded by the plastic package molding compound 4 while the active upper side 8 of the semiconductor chips 3 visible here is freely accessible and the opposite rear side 10 of the semiconductor chips 3 is also initially exposed.

The plastic package molding compound 4 and the active upper sides 8 of the semiconductor chips 3 form a coplanar upper side 6 of the composite board 2. Disposed on the coplanar upper side 6 of the composite board 2 in the area of the active upper sides 8 of the semiconductor chips 3 are contact areas 19 which are electrically connected to the individual semiconductor elements of an integrated circuit of the semiconductor chip 3.

Figure 2:
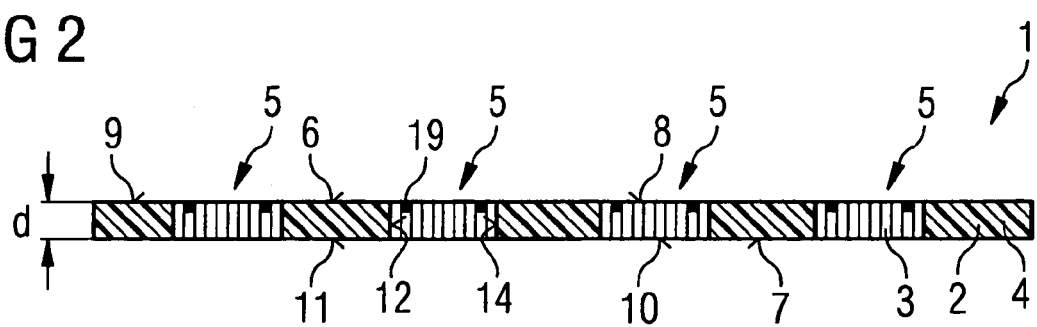
FIG. 2 illustrates a schematic cross section through the composite board according to FIG. 1.

FIG. 2 illustrates a schematic cross section through the composite board 2 according to FIG. 1. The thickness d of the composite board 2 corresponds to the thickness of the semiconductor chips 3 and the plastic package molding compound 4 so that coplanar surfaces 9 and 11 are respectively formed both on the upper side 8 and on the rear side 7 of the composite board 2, on which surfaces further processes can be carried out. This composite board 2 having a thickness d which corresponds to the semiconductor chips 3 is self-supporting and, since no plastic package molding compound 4 is disposed on the upper side 8 of the semiconductor chips 3 or on the rear side 10 of the semiconductor chips 3, this composite board is in principle completely free from bowing when the composite board 2 is heated for further processes, such as soldering-on external contacts for example. This freedom from bowing has the advantage that subsequent processes, especially photolithographic steps, can be carried out very precisely and result in extremely precise structures.

FIG. 3 illustrates a schematic diagram where the bowing in μm of a panel having a wafer contour with a diameter of around 300 mm according to the prior art illustrated by curves A and B is compared with a panel according to an embodiment of the present invention illustrated by the hatched area C in FIG. 3. In this type of bowing measurement, the edge areas of about 40 mm to the edge of the respective wafer having a semiconductor wafer contour are relatively inaccurate while the measurement between 40 mm and 240 mm diameter illustrates relatively accurately that a bowing of up to 1500 μm compared with the center M is obtained in a conventional panel. This type of bowing of almost 1.5 mm between the edge and center of a composite board or a panel with a semiconductor wafer contour causes problems with the accurate formation of wiring structures on these bowed composite boards or panels. Furthermore, there is the risk of delamination.

In this case, curve A has been measured in a direction through the center point M of the composite board and curve B has been measured on a line perpendicular to the measurement line of curve A on the upper side of the composite board or the panel having a semiconductor wafer contour. In this case, the differences between curve A and curve B are relatively small but both curves illustrate the abovementioned bowing of at least 1.5 mm from the center to the edge. In contrast, the bowing in the composite board having a semiconductor wafer contour according to the invention lies in the shaded area C of the diagram and the difference towards the edge is substantially less than 250 μm or 0.25 mm. With such small bowing, it is possible to implement photolithographic structures on the composite board.

FIGS. 4 to 11 illustrate schematic cross sections through fabrication stages of a panel 1 according to one embodiment of the invention. Components having the same functions as in the preceding figures are characterized by the same reference numerals and are not additionally discussed.

FIG. 4 illustrates a schematic cross section through a carrier 26 with semiconductor chips 3 in semiconductor component positions 5. Here the semiconductor chips 3 are fixed with their upper sides 8 and contact areas 19 located thereon to the upper side 28 of the carrier 26 using a double-sided adhesive film 27. The semiconductor chips 3 are fixed in the semiconductor component positions 5 in rows and columns on the carrier 26 using automatic insertion equipment which takes up the portions of a semiconductor wafer separated into semiconductor chips 3 and exactly positions and fixes them using the film 27 on the upper side 28 of the carrier 26.

FIG. 5 illustrates a schematic cross section through the carrier 26 according to FIG. 4 after applying a plastic package molding compound 4 between the semiconductor chips 3 and forming a coplanar rear side 7 and a coplanar upper side 6 of a composite board 2. The planeness of the coplanar upper side 6 of the composite board 2 being formed depends on the planeness of the carrier 26 and the double-sided adhesive film 27 disposed thereon. The planeness of the coplanar rear side 7 of this composite board 2 depends on the precision of the application of the plastic package molding compound 4 by means of injection molding or dispensing techniques.

FIG. 6 illustrates a schematic cross section through the carrier 26 according to FIG. 5 when laminating a plastic film 29 onto the coplanar rear side 7 of the composite board 2. A heated roller 31 is used for laminating, which rolls in the direction of the arrow D, on the one hand, and by pressing in the direction of the arrow E laminates the plastic film 29 on the coplanar rear side 7 of the composite board 2 while pressing. The coplanar surfaces 11 toward the rear side 8 of the semiconductor chips 3 or the plastic package molding compound 4 are thereby provided with a plastic layer 16 and the anchoring of the semiconductor chips 3 in the semiconductor component positions 5 improves. On the other hand, this plastic layer 16 is thin and its coefficient of thermal expansion is matched to the coefficient of thermal expansion of the composite board 2 such that no bowing forces emanate from the plastic layer 16 comprising a plastic film 29.

FIG. 7 illustrates a schematic cross section through the carrier 26 with composite board 2 according to FIG. 6 after laminating the plastic film 29 illustrated in FIG. 6. The thickness of the plastic film 29 is reduced considerably by the laminating so that there is no risk of bowing under thermal loading of the composite board 2 from the plastic layer 16. At the same time, any height differences between plastic package molding compound 4 and semiconductor chips 3 are compensated by the plastic layer 16.

FIG. 8 illustrates a schematic cross section through the self-supporting composite board 2 after removing the carrier 26, illustrated in FIG. 7, from the upper side 6 of the composite board 2. This removal of the carrier can be accomplished by heating the composite board 2 and the carrier, whereby the double-sided adhesive film, as illustrated in the preceding figures, loses its adhesive effect and the carrier can be pulled away from the upper side 6 of the composite board 2 without any appreciable action of force on the composite board 2. At the same time, the coplanar upper side 6 of the composite board 2 thus becomes freely accessible so that both the contact areas 19 and also the remaining surface 8 of the semiconductor chips 3 as well as the plastic package molding compound 4 are available for photolithographic processes.

FIG. 9 illustrates a schematic cross section through the self-supporting composite board 2 according to FIG. 8 after applying a wiring structure 17 to the coplanar upper side 6 of the composite board 2. This wiring structure 17 principally consists of conductor tracks 18 which electrically interconnect external contact areas 20 on the upper side of the plastic package molding compound 4 to contact areas 19 on the active upper sides 8 of the semiconductor chips 3. These external contact areas 20 at the same time also form the external contact areas of the individual semiconductor components in the individual semiconductor component positions 5.

Figure 10:
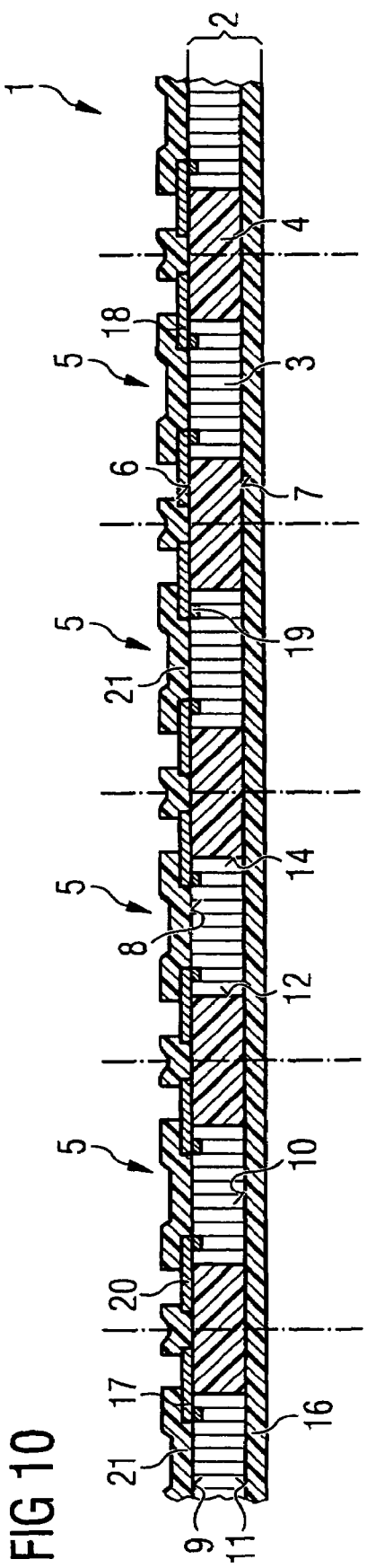
FIG. 10 illustrates a schematic cross section through the self-supporting composite board according to FIG. 9 after applying a masking lacquer layer to the coplanar upper side of the composite board.

FIG. 10 illustrates a schematic cross section through the self-supporting composite board 2 according to FIG. 9 after applying a masking lacquer layer 21 to the wiring structure 17 of the coplanar upper side 6 of the composite board 2, leaving the external contact areas 20 exposed.

Figure 11:
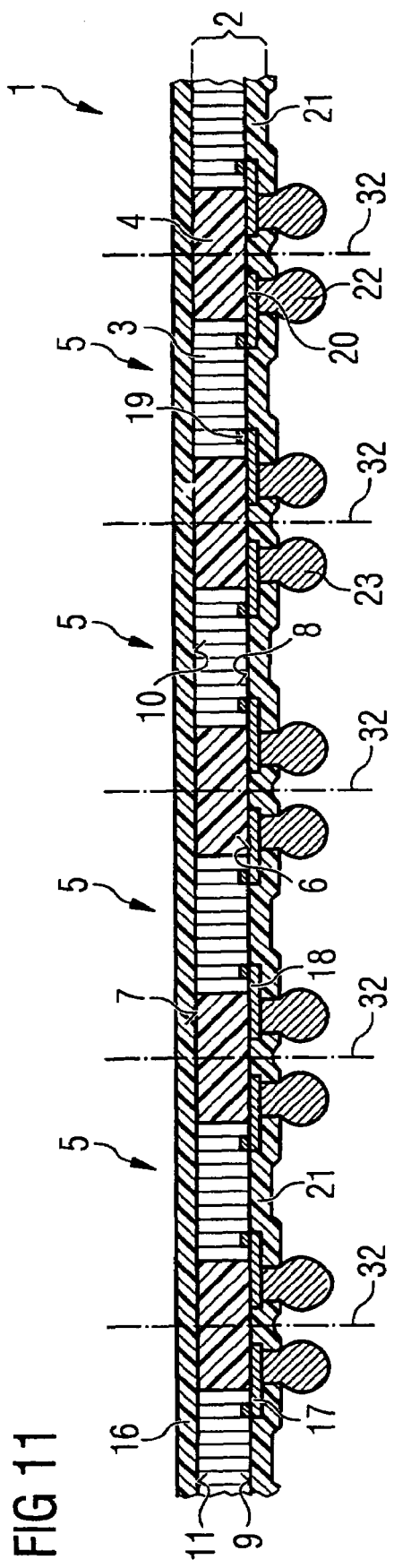
FIG. 11 illustrates a schematic cross section through a panel after applying external contacts to the coplanar upper side of the composite board according to FIG. 10.

FIG. 11 illustrates a schematic cross section through a panel 1 after applying external contacts 22 in the form of solder balls 23 to the external contact areas 20 on the coplanar upper side 6 of the composite board 2. With this step, the panel 1 is almost completed and illustrates a complete semiconductor component according to the invention in each of the semiconductor component positions 5. A last process step merely separates the panel 1 into semiconductor components 30 along the dash-dot lines 32, one of which components is illustrated in FIG. 12.

Figure 12:
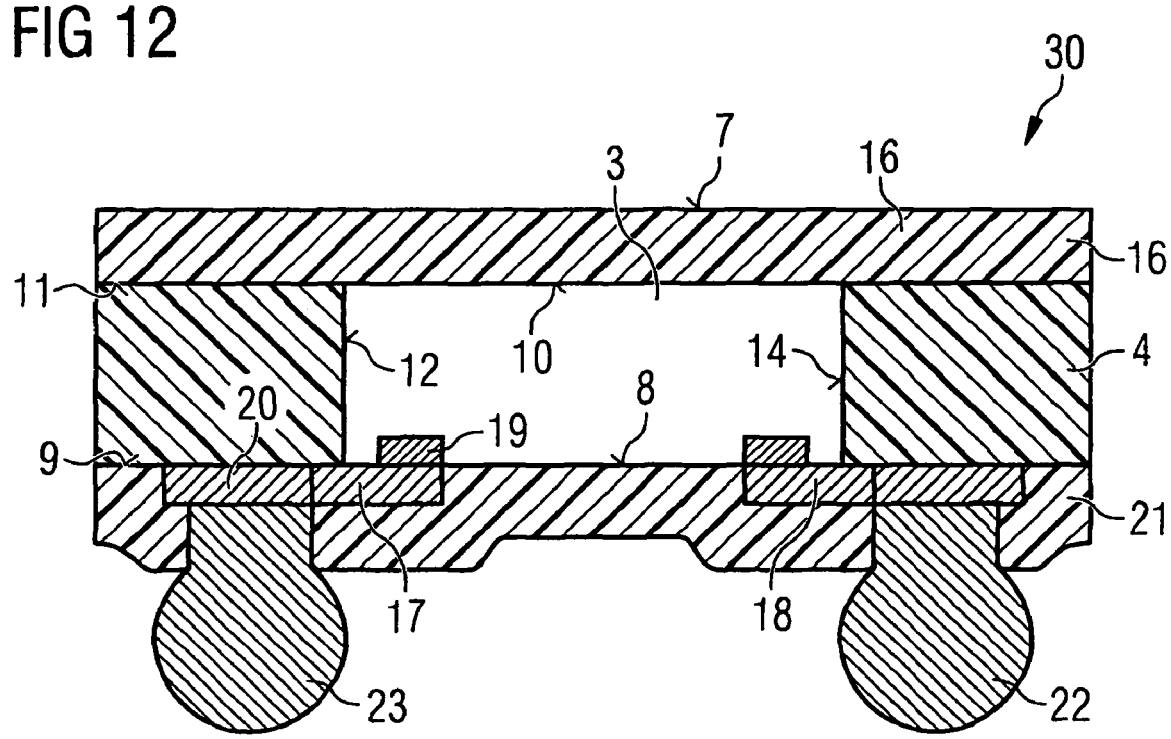
FIG. 12 illustrates a schematic cross section through a semiconductor component after separating the panel according to FIG. 11 into individual semiconductor components.

FIG. 12 illustrates a schematic cross section through a semiconductor component 30 after separating the panel 1 into individual semiconductor components 30. Components having the same functions as in the preceding figures are characterized by the same reference numerals and are not explained additionally.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A panel comprising:
   a composite board with semiconductor chips arranged in rows and columns in a plastic package molding compound with a plurality of semiconductor component positions,
   in which the composite board comprises an upper side and rear side, wherein the plastic package molding compound embeds the edge sides of the semiconductor chips and has a thickness which corresponds to the thickness of the semiconductor chips such that the active upper sides of the semiconductor chips and an upper side of the plastic package molding compound are coplanar with one another and together form the upper side of the composite board and the rear sides of the semiconductor chips and a rear side of the plastic package molding compound are coplanar with one another and together from the rear side of the composite board; and
   wherein the panel comprises a plastic layer on the rear side of the composite board and a wiring structure on the upper side of the composite board, and wherein the wiring structure is disposed directly on the active upper sides of the semiconductor chips and directly on the upper side of the plastic package molding compound.

2. The panel as claimed in claim 1, wherein the coefficient of thermal expansion of the plastic layer on the rear side of the composite board corresponds to the coefficient of thermal expansion of the composite board.

3. The panel as claimed in claim 1, wherein the panel comprises the shape and profile of a semiconductor wafer.

4. The panel as claimed in claim 1, wherein the wiring structure on the upper side of the composite board comprises conductor tracks, wherein the conductor tracks extend from contact areas on the active upper sides of the semiconductor chips to external contact areas on the plastic package molding compound of the composite board.

5. The panel as claimed in claim 1, wherein a structured masking lacquer layer is disposed on the wiring structure, leaving external contact areas exposed.

6. The panel of claim 1, wherein the plastic layer extends across the rear side of the semiconductor chips and the rear side of the plastic package molding compound.

7. The panel as claimed in claim 5, wherein the external contact areas comprise surface-mountable external contacts.

8. The panel as claimed in claim 7, wherein the surface-mountable external contacts comprise solder balls.

* * * * *

UNITED STATES PATENT AND TRADEMARK OFFICE
CERTIFICATE OF CORRECTION

PATENT NO. : 7,619,304 B2 Page 1 of 1
APPLICATION NO. : 11/445358
DATED : November 17, 2009
INVENTOR(S) : Bauer et al.

It is certified that error appears in the above-identified patent and that said Letters Patent is hereby corrected as shown below:

Column 10, line 35, delete "extemal" and insert in place thereof --external--.

Signed and Sealed this

Fourth Day of May, 2010

David J. Kappos
*Director of the United States Patent and Trademark Office*